(12) United States Patent
Bhatia et al.

(10) Patent No.: US 6,573,728 B2
(45) Date of Patent: Jun. 3, 2003

(54) METHOD AND CIRCUIT FOR ELECTRICAL TESTING OF ISOLATION RESISTANCE OF LARGE CAPACITANCE NETWORK

(75) Inventors: Harsaran S. Bhatia, Hopewell Junction, NY (US); David C. Long, Wappingers Falls, NY (US); Kathleen M. Wiley, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/942,292

(22) Filed: Aug. 29, 2001

(65) Prior Publication Data

US 2003/0042910 A1 Mar. 6, 2003

(51) Int. Cl.⁷ .............................................. H01H 31/02
(52) U.S. Cl. ........................................ 324/537; 324/519
(58) Field of Search ................................ 324/537, 519, 324/677, 711, 718

(56) References Cited

U.S. PATENT DOCUMENTS

| | | |
|---|---|---|
| 5,266,901 A | 11/1993 | Woo |
| 5,402,072 A | 3/1995 | Chiang et al. |
| 5,432,460 A | 7/1995 | Flecha et al. |
| 5,438,272 A * | 8/1995 | Craig .......................... 324/537 |
| 5,621,327 A | 4/1997 | Chiang et al. |
| 5,744,964 A | 4/1998 | Sudo et al. |
| 6,002,267 A | 12/1999 | Malhotra et al. |
| 6,097,202 A | 8/2000 | Takahashi |
| 6,141,093 A | 10/2000 | Argyle et al. |
| 6,177,802 B1 | 1/2001 | Shabde et al. |

* cited by examiner

*Primary Examiner*—Christine K. Oda
(74) *Attorney, Agent, or Firm*—Jay H. Anderson, Esq.; McGinn & Gibb, PLLC

(57) ABSTRACT

An apparatus (and method) for testing a DC isolation resistance of a large capacitance network experiencing voltage stress, adds capacitance and resistance to a large resistance network under test, such that the direct current (DC) isolation resistance may be determined without distortion from the alternating current (AC) components of the circuit. The capacitance that is added is determined based on the capacitance of the object, the resistance of the object, and the resistance of the testing apparatus. In one embodiment, because the precise capacitance of the network under test may be unknown, the testing apparatus and method may utilize an additional large capacitor designed to obviate small fluctuations in the capacitance of the network.

19 Claims, 5 Drawing Sheets

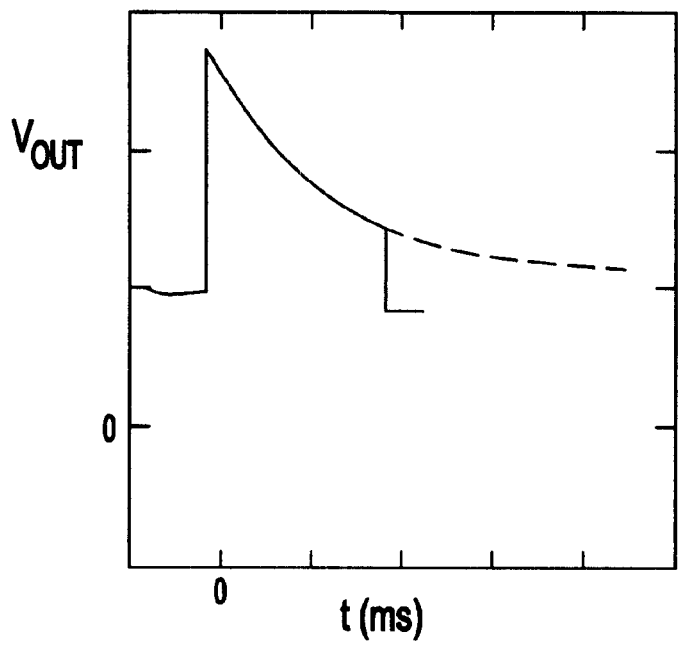
FIG.5 PRIOR ART
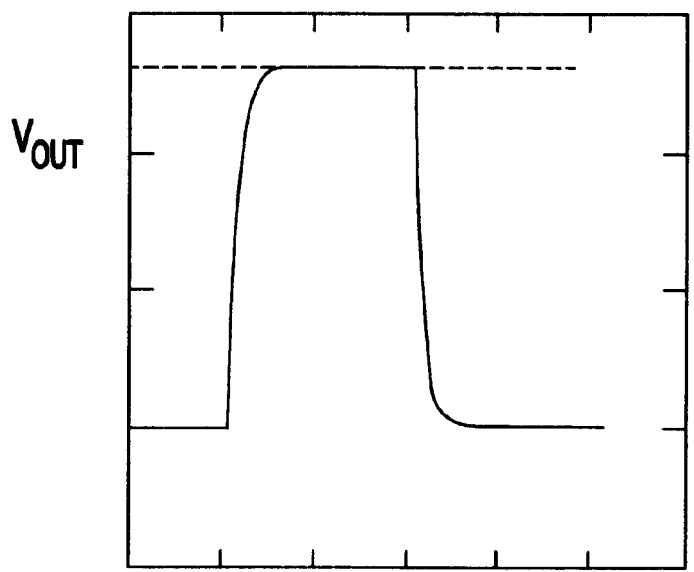
FIG.6 250ms
t (ms)

METHOD AND CIRCUIT FOR ELECTRICAL TESTING OF ISOLATION RESISTANCE OF LARGE CAPACITANCE NETWORK

BACKGROUND OF THE INVENTION

1. Field of the Invention

The present invention generally relates to a system and method for testing a direct current (DC) isolation resistance of a large capacitance network, and more specifically to a system and method for testing a DC isolation resistance of a large capacitance network experiencing voltage stress such as those found on multilayer ceramic substrates, multilayer printed circuit boards, and similar products and devices.

2. Description of the Related Art

Large capacitance networks, such as those found when testing the voltage plane to voltage plane isolation in large multilayer ceramic substrates with multiple voltage and/or ground planes, must be tested after manufacturing has been completed. These large capacitance networks generally have an electrical specification that establishes a minimum standard for a satisfactory network under test. This electrical specification may include both a DC isolation resistance standard and a voltage stress standard. Typical values are on the order of 1 Megaohm for the resistance standard and 100 volts for the voltage stress standard. Testing the DC isolation resistance while the network under test is experiencing a voltage stress is, accordingly, a necessary test for some electrical networks.

Conventional systems that test a direct current isolation resistance fall into three major categories. The first type of conventional testing apparatus performs the isolation resistance test without regard to a voltage stress. Although this type of testing apparatus has the benefit of a relatively quick testing time, this type of testing apparatus entirely fails to address the voltage stress requirement. Accordingly, although testing apparatus that fail to apply a voltage stress may be relatively efficient with respect to time, this type of testing apparatus may fail to fully test whether a network fully satisfies its electrical specification.

The second type of conventional testing apparatus performs the isolation resistance test while the network under test is experiencing a voltage stress, but fails to allow the network to achieve a steady state. For example, a network may need X seconds to achieve a steady state, and this second type of testing apparatus may take a measurement after (0.05)X and estimate a final DC resistance value based on the results of the initial test. By way of specific example, for a testing apparatus of this type, a network may require 5 seconds to achieve a steady state when a 100 volts of stress is needed, and the isolation resistance may be measured at 200 ms. This test may be satisfactory when the capacitance of the network under test is relatively small and stable. FIG. 5 provides an output waveform from one measurement of isolation resistance of a 127 mm multilayer ceramic substrate with a network capacitance of 0.05 microfarads using a conventional test apparatus of this type in conjunction with an estimation method. However, current networks on large ceramic substrates, for example, may have variations of up to 50% in voltage plane capacitance not only from product to product, but also within a single product's multiple voltage planes. This may cause flawed isolation resistance value determinations using the estimation of steady state resistance. Estimations will vary widely based on the capacitance of the network under test.

The third type of conventional testing apparatus performs the isolation resistance test while the network is experiencing voltage stress and after the network under test has achieved a steady state. Although this third type of conventional testing apparatus accurately measures isolation resistance of large capacitance networks while the networks are experiencing voltage stress, this type of testing device requires a relatively long duration to test a single network. For example, current 127 mm multilayer ceramic products with voltage plane capacitances in the range of 0.05 microfarads to 0.1 microfarads that need 100 volts of stress may require 5 seconds to achieve a steady state. Furthermore, conventional systems may require transferring the network under test to a special testing apparatus, which further increases the cycle time of the test.

SUMMARY OF THE INVENTION

In view of the above and other problems of the invention and systems and technologies, it is an object of the invention to provide a system and method for measuring an isolation resistance for large capacitance networks experiencing voltage stress.

It is a further object of the invention to provide a system and method for measuring an isolation resistance for large capacitance networks experiencing voltage stress with reduced test cycle time, reduced handling requirements, and/or increased accuracy.

According to one embodiment of the invention, these objects are achieved by a testing apparatus for determining whether the DC isolation resistance of a large capacitance network is greater than, equal to, or less than a minimum allowable isolation resistance of Rspec, the large capacitance network having a network capacitance of Cvp. This testing apparatus includes a voltage generator for supplying an input voltage, an external resistor or combination of resistances having a total resistance of Rin electrically connected to and removable from the large capacitance network, an external capacitor having a capacitance of Cbal electrically connected to and removable from the large capacitance network, wherein Rspec multiplied by Cvp is equal to Rin multiplied by Cbal, and an output waveform measuring device for measuring a linear slope of an output waveform, wherein a slope of the output waveform indicates whether the isolation resistance of the large capacitance network is greater than Rspec.

By adding the external capacitance and resistance to the large resistance network under test, the DC isolation resistance may be determined without distortion from the AC components of the circuit. The capacitance of the external capacitor is determined based on the capacitance of the network, the resistance of the network, and the resistance of the testing apparatus, as described in more detail below.

These objects may also be achieved in accordance with the present invention by a method for determining whether a DC isolation resistance Rvp of a large capacitance network is greater than, equal to, or less than a minimum allowable isolation resistance of Rspec, the large capacitance network having a network capacitance of Cvp. The method may include electrically connecting an external resistor having a resistance of Rin to the large capacitance network, electrically connecting an external capacitor having a capacitance of Cbal to the large capacitance network, wherein Rspec multiplied by Cvp is equal to Rin multiplied by Cbal, supplying an input voltage to the external resistor, the external capacitor, and the large capacitance network, measuring the output voltage, and determining whether the isolation resistance of the large capacitance network is greater than Rspec based on a slope of the output waveform.

In another embodiment of the present invention, an additional external capacitor (Clim) may be provided in order to obviate or swamp out fluctuations in the capacitance of the network. By adding Clim in parallel with Cvp and making Clim at least approximately ten times greater than the maximum Cvp for the type of network under test, the effect of Cvp on the output waveform is relatively small and generally does not influence whether the network under test satisfies its electrical specification. In this embodiment, the invention includes a voltage generator for supplying an input voltage, an external resistor having a resistance of Rin electrically connected to and removable from the large capacitance network, a swamp capacitor having a capacitance of Clim connected in parallel to Cvp, wherein Clim is at least approximately ten times greater than Cvp, an external capacitor having a capacitance of Cbal electrically connected to and removable from the large capacitance network, wherein Rspec multiplied by Clim is equal to Rin multiplied by Cbal, and an output waveform measuring device for measuring a linear slope of an output waveform, wherein a slope of the output waveform indicates whether Rvp is greater than Rspec.

BRIEF DESCRIPTION OF THE DRAWINGS

The foregoing and other objects, aspects and advantages will be better understood from the following detailed description of two preferred embodiments of the invention with reference to the drawings, in which:

FIG. 5 is an output waveform for a multilayer ceramic substrate with a voltage plane capacitance of 0.05 microfarads test using a conventional test apparatus in conjunction with an estimation method;

FIG. 6 is an output waveform for a multilayer ceramic substrate with voltage plane capacitance of 0.1 microfarads test in which Rvp is equal to Rspec (pass);

All of these figures are for the sake of clarity and are not shown in precise dimensions, nor are the relationships between the dimensions drawn to scale.

DETAILED DESCRIPTION OF THE PREFERRED EMBODIMENTS OF THE INVENTION

Figure 1:
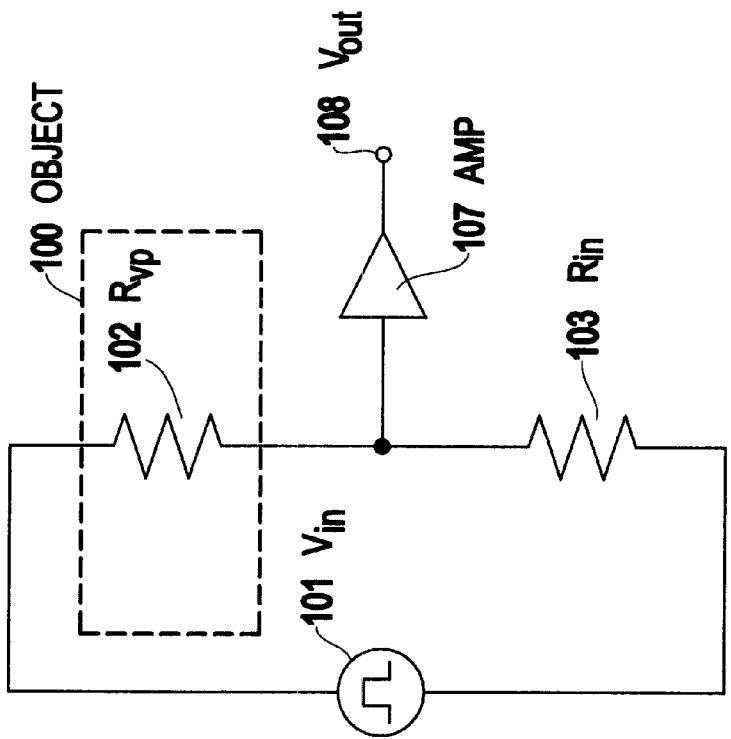
FIG. 1 is a schematic diagram of a conventional test apparatus for a network having little or no capacitance.

Referring now to the drawings, FIG. 1 is a schematic diagram of a conventional test apparatus for a network having little or no capacitance. By applying an input voltage Vin 101, knowing the resistance of Rin 103, and measuring an output waveform measured at Vout 108, the voltage plane resistance of the network under test, such as a multilayer ceramic substrate, may be determined.

Figure 2:
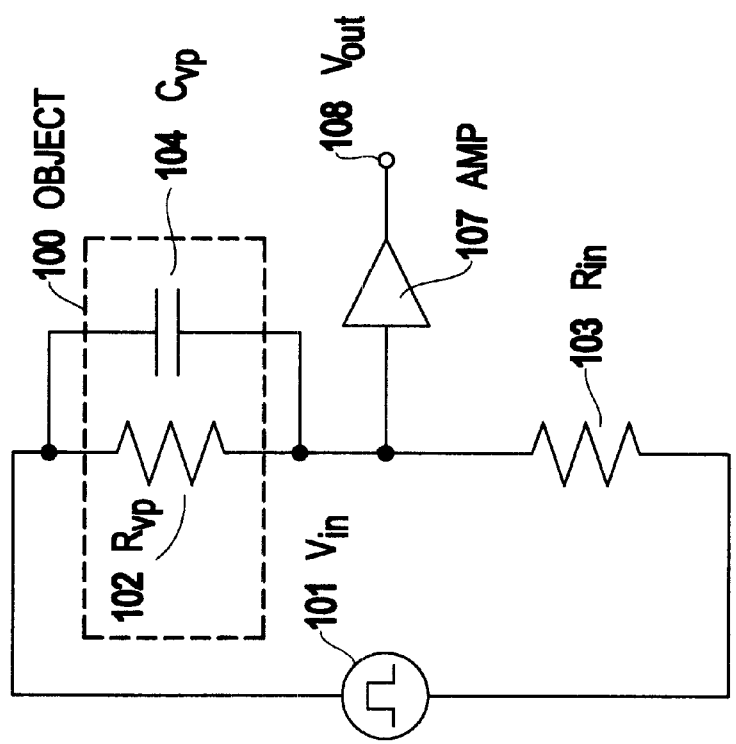
FIG. 2 is a schematic diagram of a conventional test apparatus for a network having large capacitance.

However, as shown in FIG. 2, many networks have voltage plane capacitance Cvp that can skew the output results. Specifically, while the internal capacitance of the network is achieving a stable state, the output waveform does not indicate whether the internal resistance of the network under test satisfies the electrical specification. The greater Cvp is, the longer the period of time required to achieve a steady state. The less consistent Cvp is for a particular network, the less accurate any isolation resistance estimate will be. For example, the greater the degree of uncertainty between the voltage plane capacitance of a network under test and a benchmark voltage plane capacitance, the less accurate any type of estimation based on a measurement taken prior to the network achieving steady state will be.

First Embodiment

Figure 3:
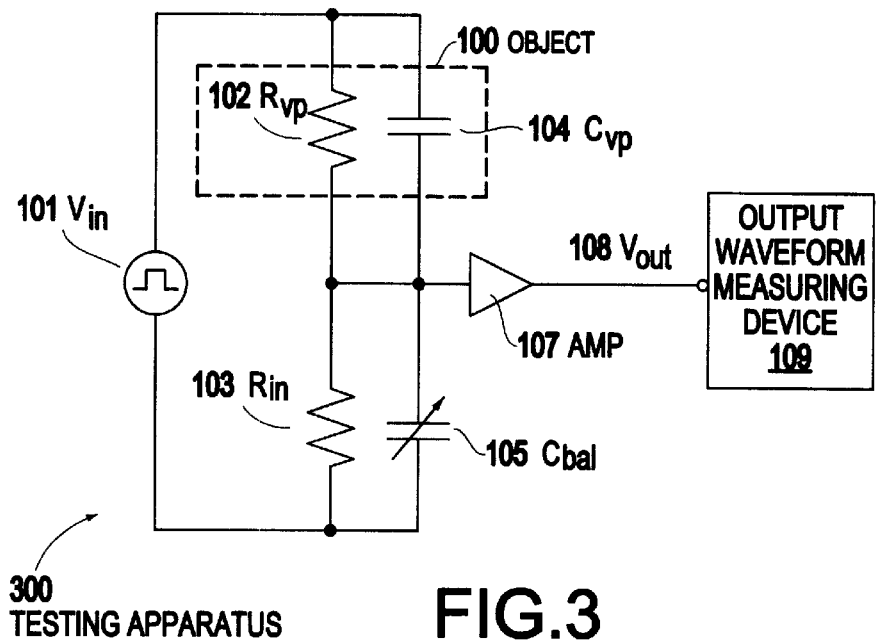
FIG. 3 is a schematic diagram of a test apparatus in accordance with a first embodiment of the present invention.

Accordingly, referring to FIG. 3, a first embodiment of the present invention for determining whether a DC isolation resistance Rvp of a large capacitance network is greater than, equal to, or less than a minimum allowable isolation resistance of Rspec includes voltage generator 101, external resistor 103, external capacitor 105, and a waveform measuring device 109. Each of these components will be discussed in turn.

Voltage generator 101 supplies an input voltage, usually on the order of 100 to 200 volts. In one embodiment, voltage generator 101 provides a square pulse input waveform. Voltage generator is electrically connected to the network 100, external resistor 103, and external capacitor 105.

External resistor 103 has a resistance of Rin which is typically in the 500 KiloOhm to 5 MegaOhm range. It is electrically connected to the network. Additionally, because it is a resistor for testing purposes, external resistor 103 is removable from network 100 without damage to or modification of the network 100. Similarly, external capacitor 105 has a capacitance of Cbal, usually around 2 microfarads. It is electrically connected to the network. Again, because external capacitor 105 is a capacitor for testing purposes, it is removable from network 100 without damage to or modification of network 100.

In order for external resistor 103 and external capacitor 105 to null out the internal capacitance of network 100, Rin and Cbal must be selected such that Rin multiplied by Cbal is equal to Rspec multiplied by Cvp. This concept is described more fully below. Amplifier 107 is electrically connected to network 100, external resistor 103, and external capacitor Cbal 105. It is configured to isolate the output signal and drive the output signal to the output waveform measuring device.

The output waveform measuring device 109 is configured to measure a linear slope of an output waveform. A slope of the output waveform indicates whether Rvp is greater than, equal to, or less than Rspec. The correlation between the slope of the output waveform and the value of Rvp will now be discussed.

Regarding the operation of this first embodiment of the present invention, the testing apparatus is configured such that a slope of the output waveform can be used to determine whether Rvp is greater than, equal to, or less than Rspec.

Specifically, it is known that $R1*C1=R2*C2$. In the embodiment of FIG. 3, Cvp is known. Rin and Cbal may be selected based on network 100 parameters Rvp and Cvp. Accordingly, although Rin and Cbal may vary, their values are also known. Isolation resistance of the network under test Rvp 102 is not known. However, the minimum allowable isolation resistance, Rspec, is also known based on the electrical specification. By tuning test apparatus 300 such that Rspec*Cvp=Rin*Cbal, the value of Rvp can be approximated. Furthermore, it can be determined whether Rvp is less than Rspec (fail), or greater than or equal to Rspec (pass).

Specifically, by measuring the output waveform at Vout 108, the characteristics of testing apparatus 300 may be determined. Because Vin comprises a square waveform, Vout should also comprise a square waveform if Rvp=Rspec. Accordingly, if the slope of the square pulse waveform measured at Vout is flat, Rvp is equal to Rspec, and the network passes the voltage stress DC isolation resistance aspect of the electrical specification. FIG. 6 depicts an output waveform for a multilayer ceramic substrate with voltage plane capacitance of 0.1 microfarads in which Rvp is equal to Rspec, as indicated by the flat slope of the square pulse.

Figure 7:
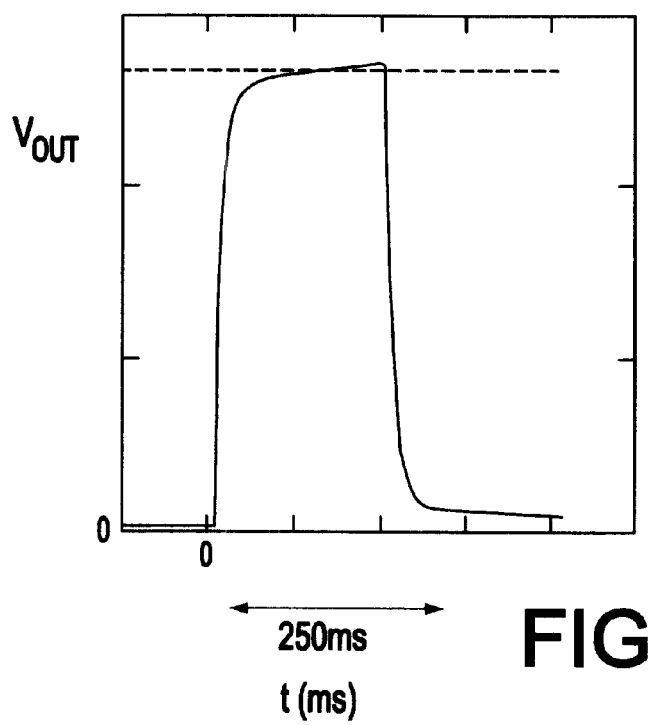
FIG. 7 is an output waveform for a multilayer ceramic substrate with voltage plane capacitance of 0.1 microfarads test in which Rvp is less than Rspec (fail)

If the slope of the square pulse waveform measured at Vout is positive, Rvp is less than Rspec, and the network fails the voltage stress DC isolation resistance aspect of the electrical specification. FIG. 7 depicts an output waveform for a multilayer ceramic substrate with voltage plane capacitance of 0.1 microfarads in which Rvp is less to Rspec, as indicated by the positive slope of the square pulse.

Figure 8:
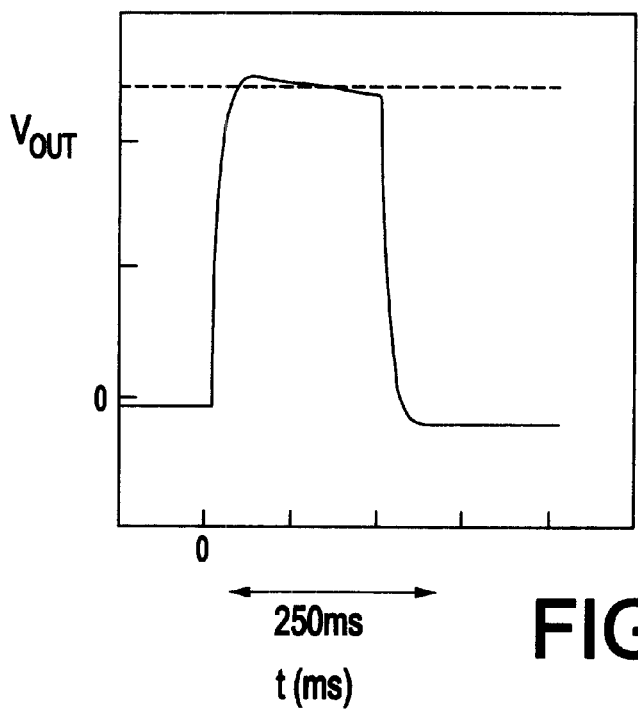
FIG. 8 is an output waveform for a multilayer ceramic substrate with voltage plane capacitance of 0.1 microfarads test in which Rvp is greater than Rspec (pass)
Figure 9:
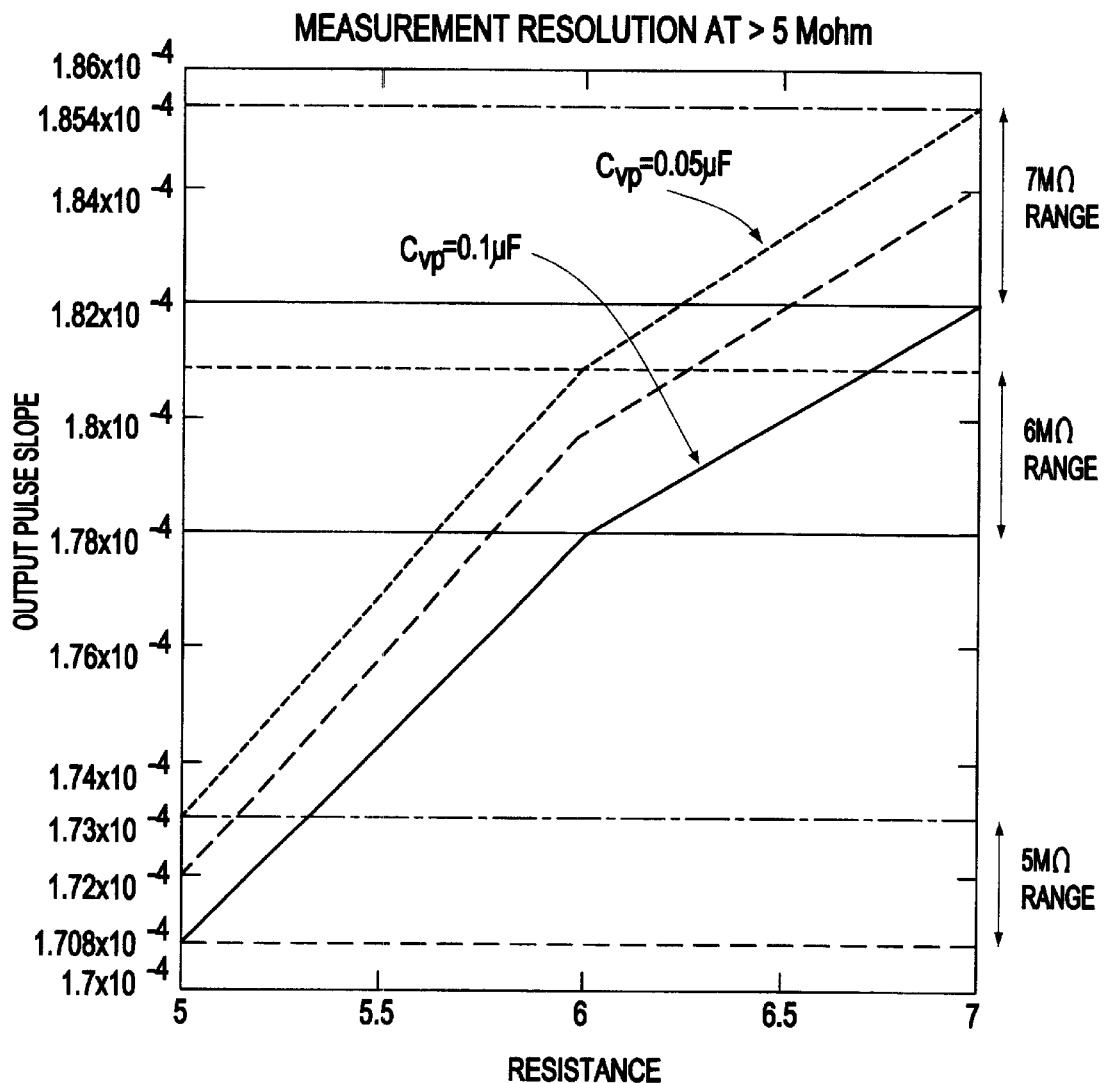
FIG. 9 is a graph showing the use of the present invention for products of differing voltage plane capacitance.

Finally, if the slope of the square pulse waveform measured at Vout is negative, Rvp is greater than Rspec, and the network passes the voltage stress DC isolation resistance aspect of the electrical specification. FIG. 8 depicts an output waveform for a multilayer ceramic substrate with voltage plane capacitance of 0.1 microfarads in which Rvp is greater than Rspec, as indicated by the negative slope of the square pulse.

In addition to determining whether the network satisfies the voltage stress DC isolation resistance aspect of the electrical specification, the present invention may be utilized to determine a degree of difference between Rvp and Rspec. Specifically, value of the linear slope of the output waveform slope may be used to identify a magnitude of a difference between Rvp and Rspec. The closer the slope of the output waveform is to flat, the closer Rvp is to Rspec. The greater the angle of the output waveform slope (either positive or negative), the further Rvp is from Rspec.

Second Embodiment

Figure 4:
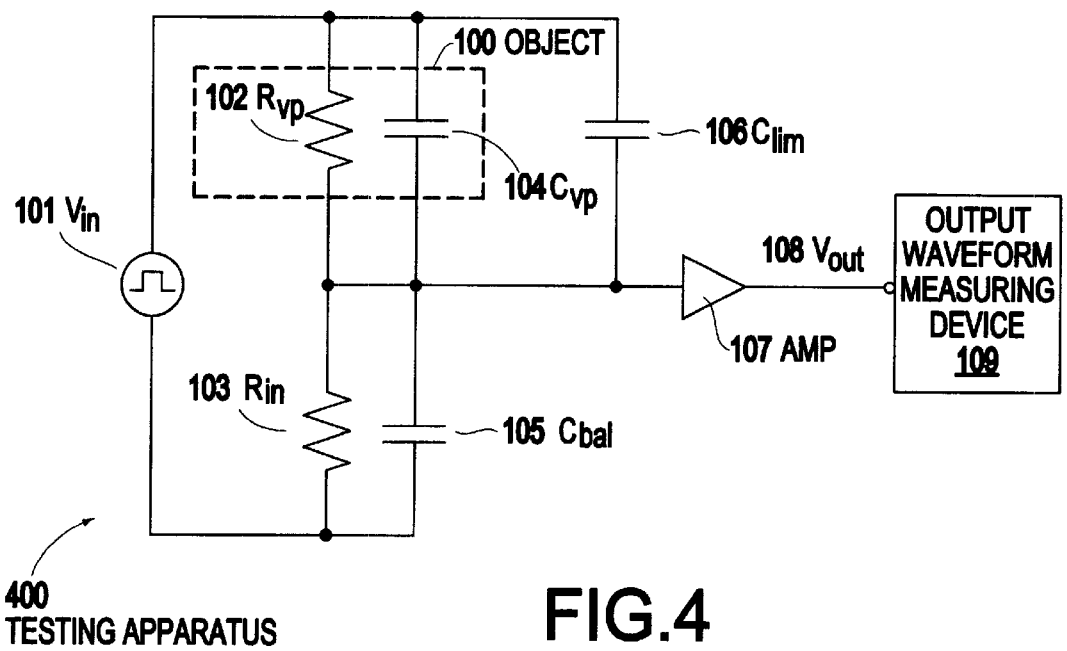
FIG. 4 is a schematic diagram of a test apparatus in accordance with a second embodiment of the present invention.

Turning to FIG. 4, a second embodiment of the present invention is depicted. Like components have been provided with the same reference number as FIG. 3. No additional discussion of these components is provided.

Because the capacitance of the network under test Cvp may not be known and its determination may not be advantageous, testing apparatus 400 additionally comprises a swamp capacitor 106 having a capacitance of Clim which on the order of 1 microfarad. By placing Clim in parallel with Cvp and making Clim at least approximately ten times greater than an expected maximum Cvp for the network under test, the impact of Cvp on the output waveform becomes diminished. Testing apparatus 400 may be balanced such that Rspec*Clim=Rin*Cbal using a methodology as disclosed above. While employing a swamp capacitor may affect the magnitude of a difference between Rvp and Rspec, testing apparatus 400 may be used to determine whether a network satisfies the voltage stress DC isolation resistance aspect of the electrical specification even though a precise value of Cvp is unknown.

Furthermore, the accuracy of testing apparatus 400 may be further increased by narrowing a range within which Cvp of a particular network under test may be. For example, a network in the multilayer ceramic substrate with voltage plane capacitance of 0.1 microfarads family may have a relatively high expected Cvp, whereas a network in the multilayer ceramic substrate with voltage plane capacitance of 0.05 microfarads family may have a relatively low expected Cvp. By knowing that the capacitance of the network under test is between the expected Cvp of a multilayer ceramic substrate with voltage plane capacitance of 0.1 microfarads (Cvp.MAX) and the expected Cvp of a multilayer ceramic substrate with voltage plane capacitance of 0.05 microfarads component (Cvp.MIN), it is possible to determine the boundaries of an acceptable output waveform slope.

Specifically, as discussed above in relation to FIG. 3, a flat slope and a negative slope indicate that Rvp for a network under test having a known Cvp is greater than Rspec (pass). If, however, the exact value of Cvp is not known, and Clim is used to diminish the effect of Cvp on the output waveform, it is possible to determine an output waveform slope range within which Rvp may equal Rspec. If the slope of the output waveform exceeds this range, Rvp is known to be less than Rspec (fail). If the output waveform has a slope lower than this range, Rvp is known to be greater than Rspec (pass).

By way of specific example, using a 5 Mohm Rspec for a network having Cvp within a range bounded by Cvp.MAX and Cvp.MIN, the range of output slopes within which Rvp may equal Rspec is bounded by SLOPEhigh and SLOPElow. If the slope of the output waveform is greater than SLOPEhigh, Rvp is known to be less than Rspec (fail). If the slope of the output waveform is less than SLOPElow, Rvp is known to be greater than Rspec (pass). If the slope of the output waveform is greater than SLOPElow and less than SLOPEhigh, it is not known whether Rvp is greater than, equal to, or less than Rspec. Networks having output waveforms falling within this unknown range may be retested using a smaller Cvp range, discarded, or dealt with in another manner based on the parameters of the test.

While the invention has been described in terms of two preferred embodiments, those skilled in the art will recognize that the invention may be practiced with modification within the spirit and scope of the appended claims.

For example, while the invention has been described exemplarily with regard to ceramic substrates, other substrates such as plastic substrates or circuit boards with high capacitance or imbedded decoupling/bypass capacitors would find great benefit in utilizing the present invention. Furthermore, the invention may be used for testing any electrical object having a high capacitance.

What is claimed is:

1. An apparatus for determining a relationship between a network's direct current (DC) isolation resistance Rvp and an allowable isolation resistance of Rspec of a network, said network having a network capacitance of Cvp, said apparatus comprising:

a voltage generator for supplying an input voltage;

an external resistor having a resistance of Rin electrically connected to and removable from the network;

an external capacitor having a capacitance of Cbal electrically connected to and removable from the network, wherein Rspec multiplied by Cvp is equal to Rin multiplied by Cbal; and an output waveform measuring device for measuring a characteristic of an output waveform, wherein the characteristic indicates whether Rvp is greater than, equal to, or less than Rspec.

2. The apparatus of claim 1, wherein the input voltage comprises a square pulse waveform.

3. The apparatus of claim 2, wherein the apparatus is configured such that when Rvp is equal to Rspec, the output waveform comprises a square pulse waveform having a flat slope.

4. The apparatus of claim 2, wherein the apparatus is configured such that when Rvp is greater than Rspec, the output waveform comprises a square pulse waveform having a negative slope.

5. The apparatus of claim 2, wherein the apparatus is configured such that when Rvp is less than Rspec, the output waveform comprises a square pulse waveform having a positive slope.

6. The apparatus of claim 2, wherein a value of the linear slope of the output
waveform slope identifies a magnitude of a difference between Rvp and Rspec.

7. The apparatus of claim 1, further comprising a swamp capacitor having a capacitance of Clim connection in parallel to Cvp.

8. A method for determining a relationship of a network's DC isolation resistance Rvp to an isolation resistance of Rspec, said network having a network capacitance of Cvp, said method comprising:

electrically connecting an external resistor having a resistance of Rin to the capacitance network;

electrically connecting an external capacitor having a capacitance of Cbal to the network, wherein Rspec multiplied by Cvp is equal to Rin multiplied by Cbal;

supplying an input voltage to the external resistor, the external capacitor, and the network;

measuring the output voltage; and determining whether the isolation resistance of the network is greater than, equal to, or less than Rspec based on a characteristic of an output waveform.

9. The method of claim 8, wherein the input voltage comprises a square pulse waveform.

10. The method of claim 9, wherein, when Rvp is equal to Rspec, the output waveform comprises a square pulse waveform having a flat slope.

11. The method of claim 9, wherein, when Rvp is greater than Rspec, the output waveform comprises a square pulse waveform having a negative slope.

12. The method of claim 9, further comprising:

electrically connecting a swamp capacitor having a capacitance of Clim connected in parallel to Cvp, wherein Clim is at least approximately ten times greater than Cvp.

13. The method of claim 9, wherein a value measure of the linear slope of the output waveform slope identifies a magnitude of a difference between Rvp and Rspec.

14. An apparatus for determining a relationship of a network's DC isolation resistance Rvp to an isolation resistance of Rspec, said network having a network capacitance of approximately Cvp, said apparatus comprising:

a voltage generator for supplying an input voltage;

an external resistor having a resistance of Rin electrically connected to and removable from the network;

a swamp capacitor having a capacitance of Clim connected in parallel to Cvp;

an external capacitor having a capacitance of Cbal electrically connected to and removable from the network, wherein Rspec multiplied by Clim is equal to Rin multiplied by Cbal; and an output waveform measuring device for measuring a linear slope of an output waveform, wherein the slope of the output waveform indicates whether Rvp is greater than Rspec.

15. The apparatus of claim 14, wherein the input voltage comprises a square pulse waveform and Clim is at least approximately ten times greater than Cvp.

16. The apparatus of claim 15, wherein the apparatus is configured such that, when Rvp is equal to Rspec, the output waveform comprises a square pulse waveform having a flat slope.

17. The apparatus of claim 15, wherein the apparatus is configured such that, when Rvp is greater than Rspec, the output waveform comprises a square pulse waveform having a negative slope.

18. The apparatus of claim 15, wherein the apparatus is configured such that, when Rvp is less than Rspec, the output waveform comprises a square pulse waveform having a positive slope.

19. The apparatus of claim 15, wherein a value measure of the linear slope of the output waveform slope identifies a magnitude of a difference between Rvp and Rspec.

* * * * *